United States Patent [19]

Crampton et al.

[11] Patent Number: 5,892,401
[45] Date of Patent: Apr. 6, 1999

[54] SOLID STATE POWER AMPLIFIER WITH LOW DISTORTION NOISE PROTECTION LIMITER

[75] Inventors: David L. Crampton, Los Alamitos; Arnold L. Berman, Los Angeles; Howard T. Ozaki, Torrance, all of Calif.

[73] Assignee: Hughes Electronics Corporation, El Segundo, Calif.

[21] Appl. No.: 876,759

[22] Filed: Jun. 16, 1997

[51] Int. Cl.⁶ .................................................. H03F 1/52
[52] U.S. Cl. ................................. 330/277; 330/298
[58] Field of Search ........................... 330/207 P, 277, 330/298; 455/116, 250.1, 252.1

[56] References Cited

U.S. PATENT DOCUMENTS

| | | | |
|---|---|---|---|
| 3,143,706 | 8/1964 | Michael | 330/298 X |
| 5,640,127 | 6/1997 | Metz | 330/298 |

*Primary Examiner*—James B. Mullins
*Attorney, Agent, or Firm*—Georgann S. Grunebach; M. W. Sales

[57] ABSTRACT

A limiter for a solid state power amplifier (SSPA) protects the amplifier against large peak, short duration noise signals while controlling drive level related phase shifts. The limiter limits noise signals to a safe input level for the power output section of the SSPA. It also uses a pair of resistor networks at its input and output to dampen reflected energy and thus control drive level related phase shifts.

16 Claims, 4 Drawing Sheets

SOLID STATE POWER AMPLIFIER WITH LOW DISTORTION NOISE PROTECTION LIMITER

BACKGROUND OF THE INVENTION

1. Field of the Invention

This invention relates to protection of a solid state power amplifier (SSPA) from large peak, short duration noise signals. More specifically, the SSPA uses a limiter which limits the noise signals and controls drive level related phase shift.

2. Description of the Related Art

An SSPA is used for communication applications in frequencies ranging from a few dozen Mhz to 10 Ghz. The SSPA output section's power transistors are subject to damage or degradation if exposed to large peak value, short duration input noise mixed with the communication signals.

One protection technique senses the SSPA output power level and feeds the signal back through an integrating comparator to drive an attenuator in the signal path prior to the output power transistors. This closed loop negative feedback protection circuit, commonly called automatic level control (ALC), maintains the average amplitude of the signals applied to the output power transistor to a safe level. The time constant of the ALC loop is selected to be very large compared to the signal bandwidth to stabilize the feedback protection system and prevent degradation of the SSPA linearity performance. This averages the response of the protection characteristics, rather than responding to shorter duration noise signals (short compared to the loop time constant). The problem with the ALC technique is that input signals containing large peak to rms content such as noise are not controlled and can damage the output power transistors, since the protection circuit is responding to an average rather than to peak noise conditions.

Another protection technique uses a limiter in the SSPA input stage to limit the maximum value of large peak value, short duration noise. However, these input limiting stages have non-ideal characteristics which cause the limiter either to degrade the amplifier linearity performance or reduce the amount of protection provided.

What is needed is a solid state power amplifier in which the output power transistors are protected from transient overdrive conditions whole simultaneously preserving the SSPA linearity.

SUMMARY OF THE INVENTION

The present invention is an SSPA which uses a limiter to limit the amplitude of input signals to the power transistors to a safe level while simultaneously preserving amplifier linearity.

An input signal which may contain noise is delivered through an input transmission line to a limiter which clips its amplitude, matches it to a maximum safe input signal for the power transistors and couples it through an output transmission line to the power transistors.

To preserve linearity during the limiting operation, drive level related phase shifts must be controlled. A phase shift reduction circuit has two resistor networks connected to the input and output of the transistor limiter at the terminating ends of the input and output transmission lines. The resistor networks dampen reflected energy in the transmission lines to control phase shifts to small levels.

In addition, an adjustable attenuator couples the limiter and output power transistors. The attenuator scales the output of the limiter so that a safe input signal is provided to the output power transistors.

DETAILED DESCRIPTION OF THE INVENTION

Figure 1:
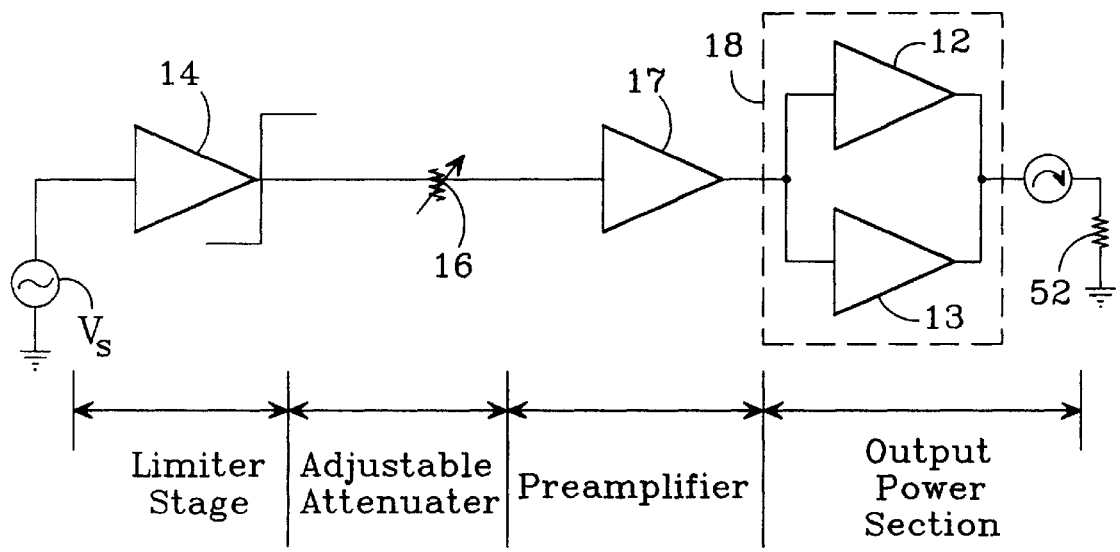
FIG. 1 is a block diagram of a preferred embodiment of the SSPA of the present invention.

FIG. 1 shows a block diagram of a preferred embodiment of the SSPA of the present invention used in S band and C band frequency communication satellite systems. The SSPA has three general objectives: to produce the needed RF power; to provide gain; and to keep the use of DC power low.

An input signal source Vs represents a ground station which transmits a microwave signal to the satellite. The signal is processed in the satellite electronics and eventually applied to the SSPA. The Vs signal contains both noise and signal information, with an amplitude that may be from the noise floor up to 10 volts and a frequency that may be from a few dozen MHz to 10 GHz. This signal is provided to a limiter 14 whose output is connected in series with an adjustable attenuator 16, a preamplifier 17, a power output section 18 and a load 52. Power output section 18 includes parallel FET power transistors 12 and 13 which are both driven continuously and operate at or near power saturation to minimize the use of DC power.

Figure 2:
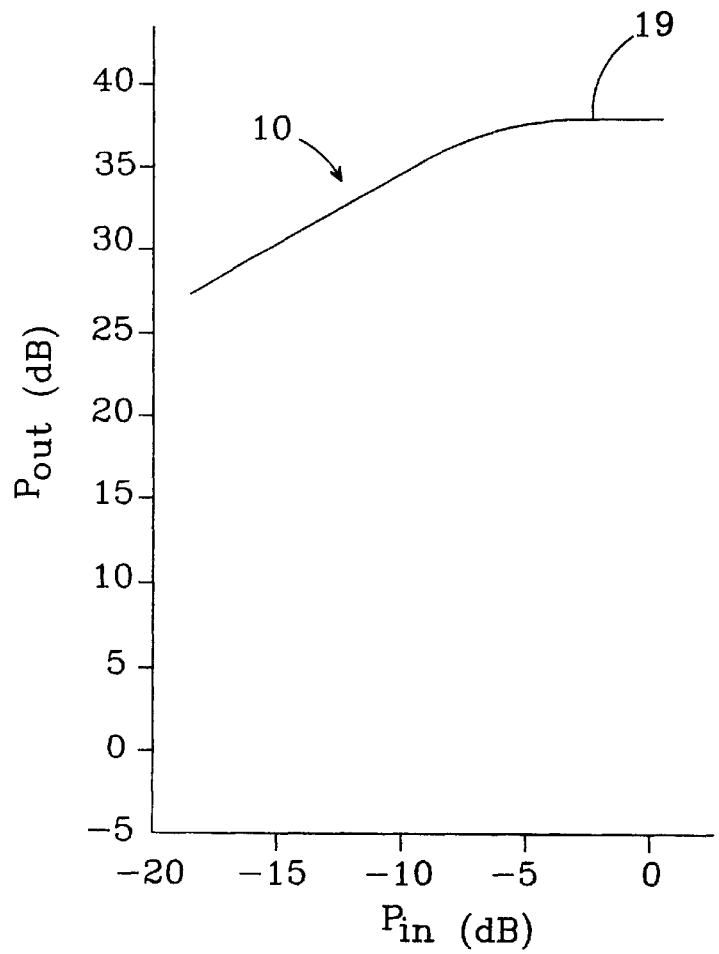
FIG. 2 is a typical power curve for an SSPA.

A typical SSPA power curve 10 is shown in FIG. 2. The saturation region, starting at point 19, is where the curve is horizontal and the output power is constant as the input power continues to increase. Since the output power section 18 operates in this region there is a risk that it will be driven deep into saturation by short duration, large peak input signals and sustain damage such as shortened life or changed characteristics.

Figure 3:
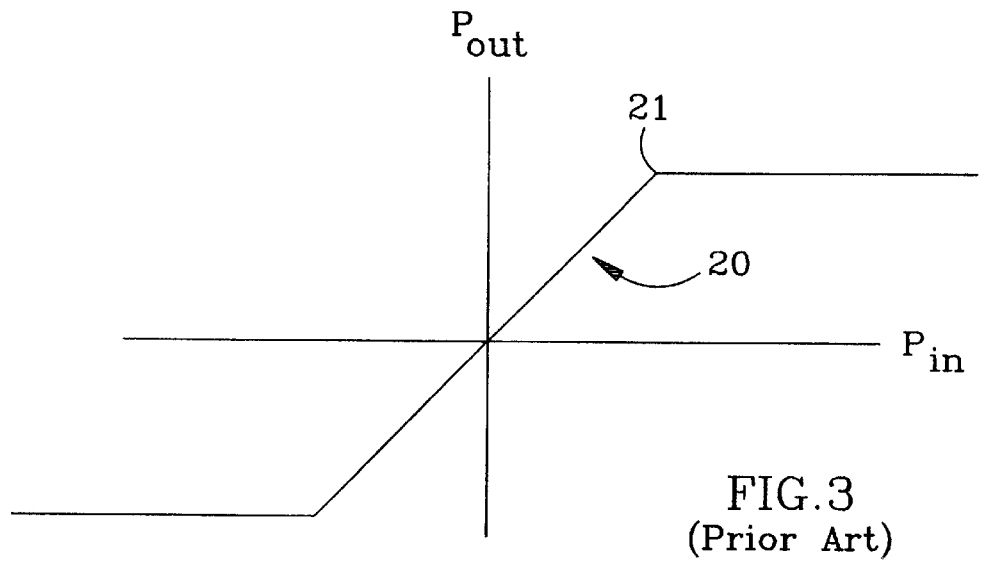
FIG. 3 is a graph showing the power transfer characteristic for the model of an ideal limiter.
Figure 4:
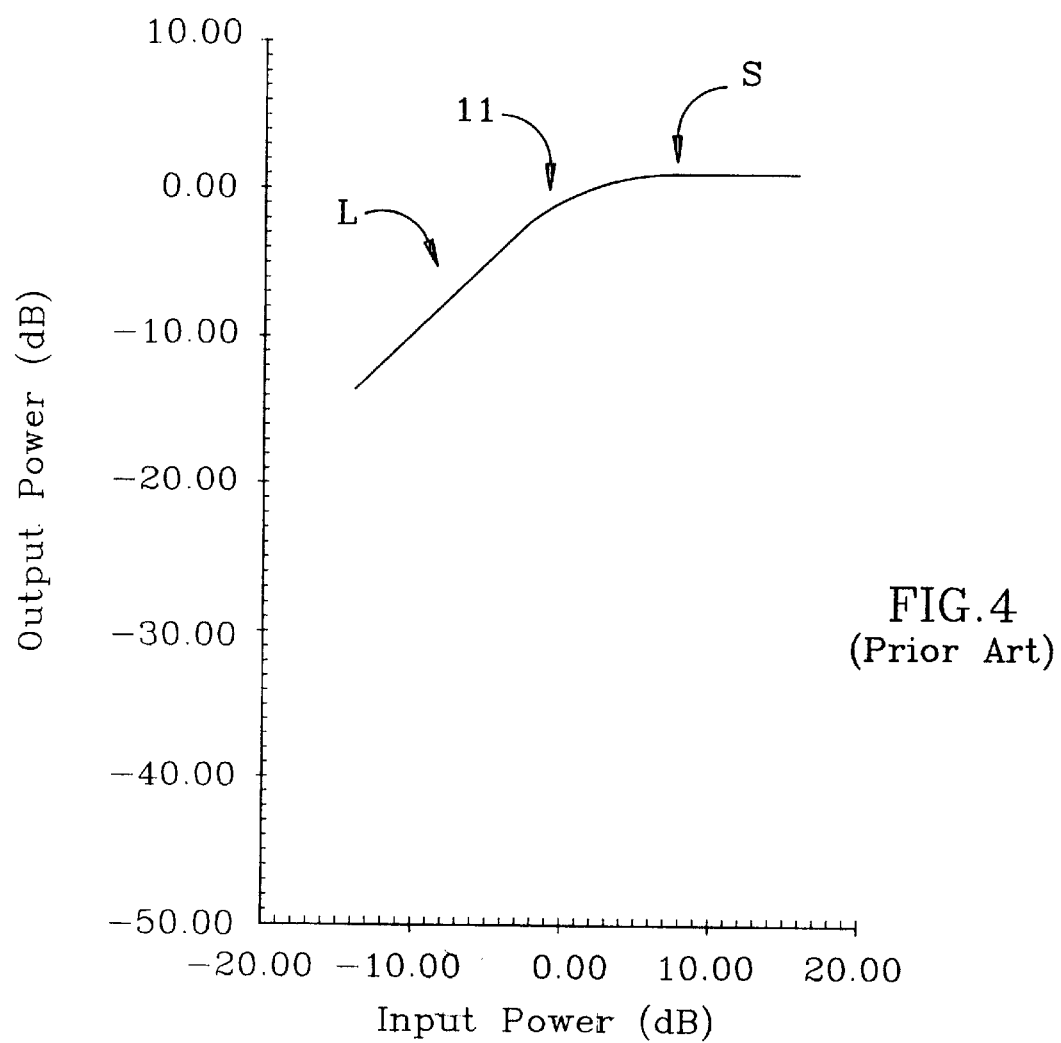
FIG. 4 is a graph showing the power transfer characteristic of a typical FET.

To solve the problem of overdriving the output power section 18, its input signal is limited to a safe signal level which results in an output at the beginning of the saturation region shown at point 19. A limiter works well to provide such a limited input signal. FIG. 3 shows the power transfer characteristic 20 for the model of an ideal limiter whose output power Pout rises linearly with the input power Pin until a saturation point 21 is reached, beyond which Pout does not increase further. The transfer characteristic of the ideal limiter allows all signals to pass which do not exceed the saturation level, and limits all larger signals. FIG. 4 shows a typical FET transfer characteristic 11 which is similar to that for the model ideal limiter. The FET power transfer curve has a linear region L where output power varies with input power, and a saturation region S at which the output power remains constant as the input power continues to increase. In the preferred embodiment of the invention, limiter 14 is an FET with a limited output signal that is matched to a safe input for output power section 18. Other limiters, for example, those using bipolar transistors, have transfer characteristics similar to those shown in FIG. 3 and are also within the scope of the invention.

An optimally designed limiter 14 may have a output that is too high or low to pass through preamplifier 17 and produce a maximum safe input for an optimally designed output power section 18. Therefore, an adjustable attenuator 16, preferably an amplifier whose gain can vary from negative to positive, scales the output of limiter 14 so that the input signal to output power section 18 is at a safe level. The attenuator 16 is adjusted once during an alignment procedure.

Figure 5:
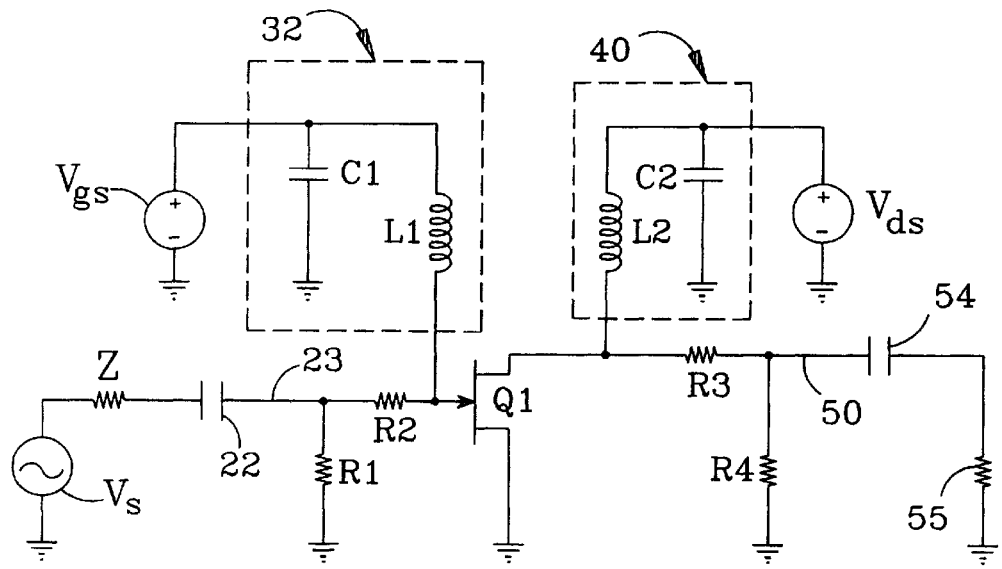
FIG. 5 is a schematic diagram of a preferred circuit for the limiter shown in FIG. 1.

FIG. 5 shows the details of a preferred FET limiter 14 which accomplishes the dual goals of limiting the input signal from source Vs and controlling drive level related phase shifts that occur in the limiting process. The input signal from source Vs (which includes internal impedance Z) is applied through a DC blocking capacitor 22, an input transmission line 23, a first resistor network consisting of shunt and series attenuating resistors R1 and R2 and then to the gate of an FET Q1. Biasing for Q1, which could be a depletion mode device, is provided from a first DC source Vgs, preferably 0–2 volts. A first LC circuit 32, comprised of shunt capacitor C1 and series inductor L1, is connected between Vgs and the gate of Q1. DC source Vgs biases the gate of Q1 at its operating point and LC circuit 32 prevents Vgs from interfering with the input signal from Vs at high frequencies.

A second DC biasing source Vds is connected to the drain of Q1 through a second LC circuit 40, comprised of capacitor C2 and inductor L2, which performs a function similar to that of LC circuit 32 by providing a DC biasing voltage from Vds to the drain of Q1, but blocking out DC at high frequencies so as not to interfere with the input signal from Vs. A low Vds drain voltage, preferably 1–5 volts, is used to insure that no breakdown effects occur during highly saturated operation when large instantaneous peak signals might occur and threaten the reliability of Q1.

A second resistor network comprised of series and shunt attenuating resistors R3 and R4 is connected between the Q1 drain and an output transmission line 50. A DC blocking capacitor 54 is coupled at one terminal to the transmission line and at the other terminal to an output load 55, typically 50 Ω, which is the input impedance of the next circuit.

In operation, limiter 14 receives an input signal from source Vs through DC blocking capacitor 22. This signal is then fed through transmission line 23 to resistor network R1 and R2 and on to the gate of Q1. It is important to reduce to a minimum any drive related phase shifts during the limiting process. These phase shifts occur because not all of the power from the input signal Vs is transmitted from transmission line 23 to the gate of Q1. The power not transferred represents reflected energy in the transmission line. This results in drive level dependent phase shifts since the magnitude and phase of the reflected signal is a function of the drive level applied to Q1. Resistor network R1 and R2 acts as a phase shift reduction circuit or attenuator for the reflected energy and greatly reduces drive related phase shifts.

Biasing sources Vgs and Vds provide the DC biasing to keep Q1 biased at saturation. At saturation Q1 acts as a limiter, since the output no longer increases as the input increases. When the input signal from Vs is applied to Q1 it is limited, as explained in connection with FIGS. 1, 3, 4, with the output of Q1 provided to the remainder of the circuitry. Inductors L1 and L2 prevent the DC bias sources Vgs and Vds from interfering with the high frequency input signal Vs. The limited Q1 output signal is fed through resistor network R3/R4 and then through output transmission line 50, which is subject to phase shifts similar to transmission line 23. Resistor network R3/R4 acts as a second phase shift reduction circuit or attenuator to absorb reflected energy from transmission line 50 and control phase shifts. The output signal from transmission line 50 is fed to the load 55, which is the impedance of the remainder of the SSPA circuit including adjustable attenuator 16, preamplifier 17, output power section 18 and load 52. The limited Q1 output signal is adjusted by adjustable attenuator 16 so that a safe input is provided to output power section 18.

Figure 6:
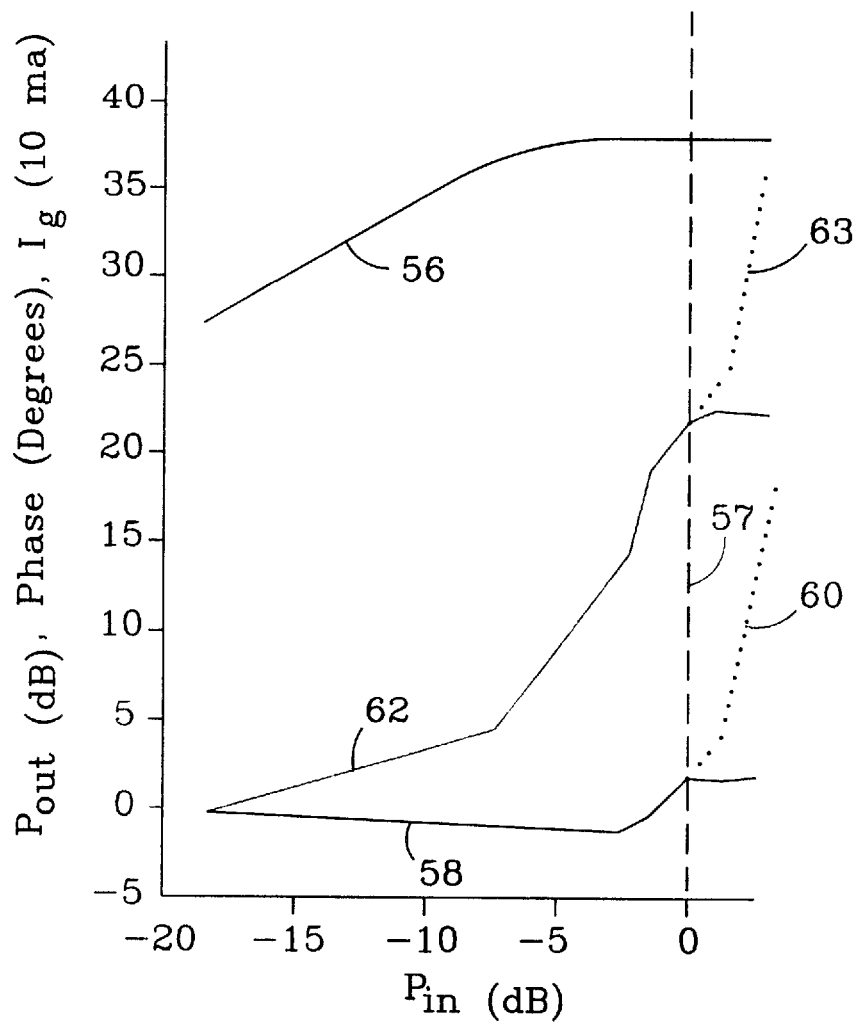
FIG. 6 is a graph showing typical power, phase shift and gate current curves for the SSPA of FIG. 1.

FIG. 6 shows graphically the effect of limiter 14 on the transfer characteristics of output power section 18. Curve 56 is the power curve for output power section 18. The output power becomes relatively constant beyond point 57, the maximum input power as set by the limiter stage. This means limiter 14 has prevented the output power section 18 from being driven deeper into saturation and becoming damaged at some point.

Curve 58 shows the effect of the limiter on the gate current of FET amplifiers 12 and 13. The gate current is constant almost up to point 57, and then experiences a slight rise which levels off beyond point 57. The dotted line illustrates the continued rise in gate current that would occur beyond point 57 in the absence of the limiter; the gate current would continue to rise and could cause damage to amplifiers 12 and 13. The solid line continuation of curve 58 beyond point 57 illustrates the gate current with the limiter.

Curve 62 illustrates the effects of the limiter on the phase shifts in the output from output power section 18. On the left side of the curve below point 57 the phase shift increases in the usual manner as Pout and Pin increase. At point 57 the phase shift essentially becomes constant as a result of the limiting action and resistor networks R1/R2 and R3/R4. The dotted line continuation 63 of curve 62 illustrates the continued increase in phase shift that would occur in the absence of the resistor dampening networks resulting in drive level dependent distortion.

Figure 7:
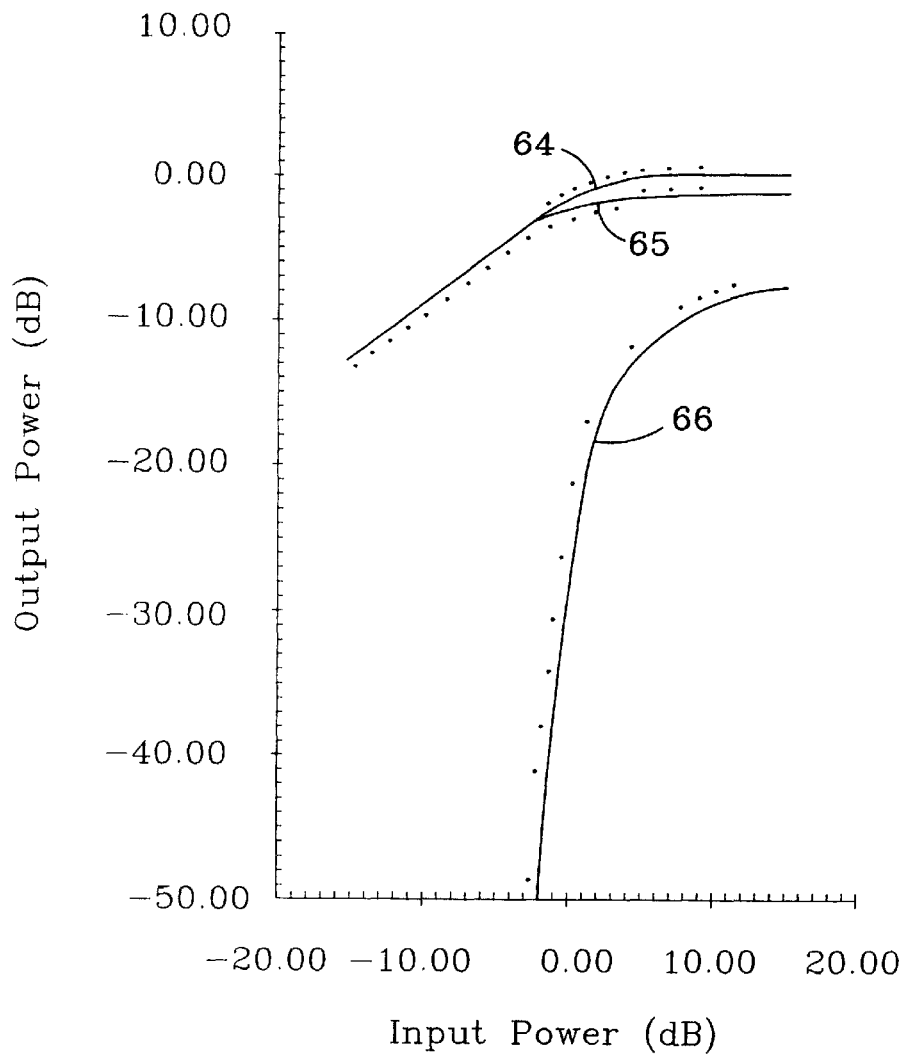
FIG. 7 is a graph showing the transfer characteristics of the near-ideal limiter of FIG. 5.

FIG. 7 shows a comparison between limiter stage experimental results in dotted lines and ideal calculated limiter operation in solid lines. These results show that the measured data tracks the calculated results very closely. In other words, the limiter achieves near ideal results. The experiments used two different amplification circumstances. In one experiment, a single frequency tone was used and the calculated results and near ideal limiter results were virtually superimposed on one another in curve 64. In another experiment two different frequency tones A and B were added to create frequencies A,B shown in curve 65. This signal was slightly smaller in amplitude than the single tone curve 64. The calculated results and near ideal limiter results for frequencies A,B are virtually superimposed on one another. The largest intermodulation product of frequencies A,B is 2A–B (third order IM), shown in curve 66. Again, the calculated results are very close to the experimental results using the near ideal limiter.

While the preferred embodiment of the invention has been shown and described, numerous variations and alternative embodiments will occur to those skilled in the art. Accordingly, it is intended that the invention be limited only in terms of the appended claims.

We claim:

1. A solid state power amplifier with reduced drive-related phase shifts, comprising:

at least one power transistor;

an adjustable attenuator preceding said power transistor; and a limiter stage preceding said adjustable attenuator, said limiter stage including:
   a) a limiter transistor having an input and an output;
   b) an input shunt resistor;
   c) an input series resistor coupling said input shunt resistor to said input;
   d) an output shunt resistor; and
   e) an output series resistor coupling said said output shunt resistor to said output;

said input shunt and input series resistors attenuating reflected energy from said limiter transistor and said output shunt and output series resistors absorbing reflected energy from said adjustable attenuator to thereby reduce said drive-related phase shifts.

2. The solid state power amplifier of claim 1, wherein said limiter stage further comprises:

an input transmission line preceding said input shunt resistor; and an output transmission line coupling said output shunt resistor and said adjustable attenuator.

3. The solid state power amplifier of claim 1, wherein said limiter transistor is biased into saturation.

4. The solid state power amplifier of claim 1, further including a preamplifier positioned between said adjustable attenuator and said power transistor.

5. The solid state power amplifier of claim 1, wherein said at least one power transistor includes first and second power transistors arranged in a parallel relationship.

6. The solid state power amplifier of claim 1, wherein said limiter and power transistors are field effect transistors.

7. A limiter that reduces drive-related phase shifts in a solid state power amplifier, comprising:

a limiter transistor having an input and an output;

an input transmission line having a transmission-line output;

an input shunt resistor coupled to said transmission-line output;

an input series resistor that couples said transmission-line output to said input;

an output transmission line having a transmission-line input;

an output shunt resistor coupled to said transmission-line input; and an output series resistor that couples said transmission-line input to said output;

said input shunt and input series resistors attenuating reflected energy from said limiter transistor and said output shunt and output series resistors absorbing reflected energy from said output transmission line to thereby reduce said drive-related phase shifts in said power amplifier.

8. The limiter of claim 7, wherein said wherein said limiter transistor is a field-effect transistor.

9. The limiter of claim 7, wherein said limiter transistor is biased into saturation.

10. A solid state power amplifier with reduced drive-related phase shifts, comprising:

at least one power transistor;

an adjustable attenuator preceding said power transistor; and a limiter stage preceding said power transistor, said limiter stage including:
   a) a limiter transistor having an input and an output;
   b) an input resistor network that precedes said input and is configured to attenuate reflected energy from said input; and
   c) an output resistor network that couples said output to said adjustable attenuator and is configured to absorb reflected energy from said adjustable attenuator;

said input and output series resistor networks thus reducing said drive-related phase shifts.

11. The solid state power amplifier of claim 10:

wherein said input resistor network includes;
   an input shunt resistor, and
   an input series resistor coupling said input shunt resistor to said input;

and wherein said output resistor network includes;
   an output shunt resistor, and
   an output series resistor coupling said output shunt resistor to said output.

12. The solid state power amplifier of claim 10, wherein said limiter stage further comprises:

an input transmission line preceding said input resistor network; and an output transmission line coupling said output resistor network and said adjustable attenuator.

13. The solid state power amplifier of claim 10, wherein said limiter transistor is biased into saturation.

14. The solid state power amplifier of claim 10, further including a preamplifier positioned between said adjustable attenuator and said power transistor.

15. The solid state power amplifier of claim 10, wherein said at least one power transistor includes first and second power transistors arranged in a parallel relationship.

16. The solid state power amplifier of claim 10, wherein said limiter and power transistors are field effect transistors.

* * * * *